(12) United States Patent
Fukuda

(10) Patent No.: US 7,675,116 B2
(45) Date of Patent: Mar. 9, 2010

(54) SEMICONDUCTOR DEVICE WITH ESD PROTECTION FUNCTION AND ESD PROTECTION CIRCUIT

(75) Inventor: Yasuhiro Fukuda, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 572 days.

(21) Appl. No.: 11/164,205

(22) Filed: Nov. 14, 2005

(65) Prior Publication Data

US 2006/0114628 A1 Jun. 1, 2006

(30) Foreign Application Priority Data

Nov. 15, 2004 (JP) ............... 2004-330159

(51) Int. Cl.
*H01L 23/62* (2006.01)
*H01L 27/01* (2006.01)
(52) U.S. Cl. ............... 257/355; 257/347; 257/356
(58) Field of Classification Search ............... 257/173, 257/347, 348, 355–357, 360, E21.703, E27.112
See application file for complete search history.

(56) References Cited

U.S. PATENT DOCUMENTS

| 6,329,694 | B1 * | 12/2001 | Lee et al. | ............... | 257/372 |
|---|---|---|---|---|---|
| 6,642,088 | B1 * | 11/2003 | Yu | ............... | 438/155 |
| 6,894,351 | B2 | 5/2005 | Okawa et al. | | |
| 2003/0230781 | A1 * | 12/2003 | Makita et al. | ............... | 257/355 |

* cited by examiner

*Primary Examiner*—Hung Vu
(74) *Attorney, Agent, or Firm*—Volentine & Whitt, P.L.L.C.

(57) ABSTRACT

A semiconductor device with an ESD protection function has an SOI substrate, first to fourth diffusion layers, and a gate. The SOI substrate has a semiconductor layer on an insulation layer. The first diffusion layer is of a first conductivity type and is formed on the semiconductor layer. The second diffusion layer is of the first conductivity type and is formed on the semiconductor layer. The third diffusion layer is of a second conductivity type and is formed on the semiconductor layer so as to be adjacent to the first and second diffusion layers. The fourth diffusion layer is of the second conductivity type and is formed on the semiconductor layer so as to be adjacent to the first diffusion layer and electrically connected to the second diffusion layer. The gate is formed over the third diffusion layer.

5 Claims, 3 Drawing Sheets

SEMICONDUCTOR DEVICE WITH ESD PROTECTION FUNCTION AND ESD PROTECTION CIRCUIT

BACKGROUND OF THE INVENTION

1. Field of the Invention

The present invention relates to a semiconductor device, which in particular is formed on an SOI (silicon on insulation) substrate and has an ESD protection function. Furthermore, the present invention relates to an ESD protection circuit which can be formed on this type of semiconductor device.

2. Background Information

In the field of semiconductor devices, especially an integrated circuit with a field effect transistor (hereinafter to be referred to as an MOS transistor), it has been an important subject as to how the device can be protected against electrostatic discharge (ESD) generated from a human body or other devices.

There are various methods and structures for protecting a semiconductor device from electrostatic surge. For example, with respect to a typical MOS transistor formed in a bulk substrate, a method of discharging electrostatic surge using a parasitic diode having a simplex polarity, which is formed within a device structure, may be applied. This parasitic diode is formed between a diffusion layer of a drain and diffusion layers which include a well layer and a layer for power dispatching of the well layer. In this case, for instance, when an output circuit constitutes a bulk structured MOS transistor, the electrostatic surge applied to a drain through an output terminal will be discharged to the power source through a well-electric supply terminal due to forward operation of the parasitic diode.

In recent years, in order to realize lower power consumption, higher efficiency and miniaturization of electronic devices, development of a semiconductor device using an SOI substrate has been actively pursued. Especially, an FD (fully depleted) type SOI-MOS transistor has been attracting attention. In this FD type SOI-MOS transistor, the semiconductor layer (SOI layer) on the insulation film is thin and has a thickness of 50 nm or less, and the transistor operates while the SOI layer is under a fully depleted state. The FD type SOI-MOS transistor can make its threshold voltage smaller, and therefore, it is considered as a very useful device in realizing low power consumption and high speed operation.

For example, one patent reference (Japanese Laid Open Patent Application No. 2003-209185, pp. 3-4, FIG. 1) discloses such semiconductor device which has a protection function against electrostatic discharge damage. The semiconductor device introduced by this patent reference uses the SOI substrate, and it has a protection element made up of a thyristor. The structure elements are disposed in the lateral direction of the SOI substrate, and connected to an input terminal, by which it discharges electrostatic surge applied from the exterior.

With respect to the above-described FD type SOI-MOS transistor, the SOI layer, which is an element formation region, is made completely separate from the support substrate by an embedded insulation film, and since the SOI layer beneath the channel is under a fully depleted state at the time of operation, a parasitic diode with a simplex polarity will not be formed through the well layer as in the case of the bulk structured MOS transistor. With the FD type SOI-MOS transistor, a parasitic diode having an opposite polarity against a parasitic diode formed between a drain region and a channel region is formed in series between a source region and the channel region. Accordingly, a compound parasitic diode having a bidirectional polarity made up of two parasitic diodes with their cathodes or anodes facing each other is formed. Therefore, if an output circuit is to be constructed of an FD type SOI-MOS transistor, the electrostatic surge applied to the drain through an output terminal has to pass through not only the parasitic diode in the forward direction but also through the parasitic diode in the opposite direction at the same time. Generally, with respect to the FD type SOI-MOS transistor, the degree of damage resistance when the electrostatic surge is applied in the opposite direction of the parasitic diode is about $1/10$ to $1/100$ of that when the electrostatic surge is applied in the forward direction (proved by HBM testing). Therefore, with respect to the FD type SOI-MOS transistor, because its typical structure has a compound parasitic diode, its damage resistance against electrostatic surge is rather low.

As mentioned above, the semiconductor device as disclosed in the patent reference functions to discharge electrostatic surge by having a thyristor type protection element connected between a MOS transistor that forms an input circuit and an external input terminal, but it does not function to discharge electrostatic surge using a parasitic diode formed within the structure of the MOS transistor.

In view of the above, it will be apparent to those skilled in the art from this disclosure that there exists a need for an improved semiconductor device having an ESD protection function and an ESD protection circuit which can be formed in such semiconductor device. This invention addresses this need in the art as well as other needs, which will become apparent to those skilled in the art from this disclosure

SUMMARY OF THE INVENTION

It is therefore an object of the present invention to resolve the above-described problems, and to provide a semiconductor device having an improved ESD protection function and an ESD protection circuit which can be formed in such semiconductor device.

In accordance with one aspect of the present invention, a semiconductor device with an ESD protection function has an SOI substrate, first to fourth diffusion layers, and a gate. The SOI substrate has a semiconductor layer on an insulation layer. The first diffusion layer is of a first conductivity type and is formed on the semiconductor layer. The second diffusion layer is of the first conductivity type and is formed on the semiconductor layer. The third diffusion layer is of a second conductivity type and is formed on the semiconductor layer so as to be adjacent to the first and second diffusion layers. The fourth diffusion layer is of the second conductivity type and is formed on the semiconductor layer so as to be adjacent to the first diffusion layer and electrically connected to the second diffusion layer. The gate is formed over the third diffusion layer.

In accordance with another aspect of the present invention, an ESD protection circuit has an output terminal, first and second power line, a p-type field effect transistor, an n-type field effect transistor, and an inter-power-supply protection circuit. The output terminal is for picking up an output signal. The first power line is connected to a voltage source on a high potential side. The second power line is connected to a voltage source on a low potential side. The p-type field effect transistor is connected between the output terminal and the first power line and has a first parasitic diode. The n-type field effect transistor is connected between the output terminal and the second power line and has a second parasitic diode. The inter-power-supply protection circuit has a protection transistor connected between the first power line and the second power line, a first capacitor connected between a gate of the protection transistor and the first power line, and a second capacitor connected between the gate of the protection transistor and the second power line.

These and other objects, features, aspects, and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

NMOS Transistor

Figure 1A:
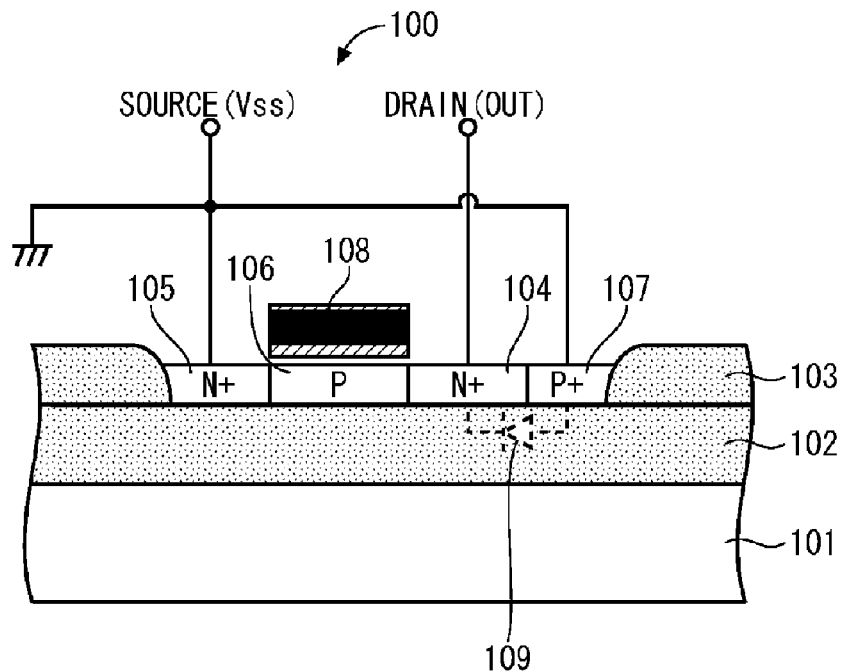
FIG. 1A is a schematic view showing a structure of an NMOS transistor according to one embodiment of the present invention.

FIG. 1A is a schematic view showing a structure of an NMOS transistor 100 which is a semiconductor device according to one embodiment of the present invention. In this embodiment, the NMOS transistor 100 is an FD type NMOS transistor which is formed on an SOI substrate, and for instance constitutes an output circuit of a semiconductor integrated circuit together with an FD type PMOS transistor 200, which will be mentioned below. In the structure of this embodiment, it is also possible to use a PD (partially depleted) type NMOS transistor. Furthermore, instead of using an SOI substrate, it is possible to use an SOS (silicon on sapphire) substrate where a monocrystal silicon layer is formed on the surface of a sapphire, an SOS (silicon on spinel) substrate where a monocrystal silicon layer is formed on the surface of a spinel, or the like.

The NMOS transistor 100 has a support substrate 101, a buried insulation film 102, a field insulation film 103, an $N^+$ layer 104 (first diffusion layer) and an $N^+$ layer 105 (second diffusion layer), a P layer 106 (third diffusion layer), a $P^+$ layer 107 (fourth diffusion layer) and a gate 108. The support substrate 101 is, for instance, a silicon substrate. The buried insulation film 102 is, for instance, a silicon oxide film. The field insulation film 103 is, for instance, a silicon oxide film for element separation and is formed by a normal LOCOS (local oxidation of silicon) method etc. On a monocrystal silicon layer, i.e. the SOI substrate, over the buried insulation film 102, the $N^+$ layers 104 and 105, the P layer 106 and the $P^+$ layer 107 are disposed in the lateral direction. The $N^+$ layer 104 corresponds to a drain region of the NMOS transistor 100 and is connected to an output terminal OUT of the semiconductor integrated circuit. The $N^+$ layer 105 corresponds to a source region of the NMOS transistor 100 and is connected to a voltage source Vss (GND) on the low potential side. The P layer 106 corresponds to a channel region of the NMOS transistor 100, and on the surface of which a surface inversion layer, i.e. a channel, that connects the drain region and the source region is formed by applying positive voltage to the gate 108. When the NMOS transistor 100 is switched on as positive voltage is applied to the gate 108, a depletion layer expands over the entire P layer 106 by which the channel region becomes fully depleted. The $P^+$ layer 107 is formed adjacent to the $N^+$ layer 104 that is the drain region, and a parasitic diode 109 having a simplex polarity, which takes the $N^+$ layer 104 as a cathode and the $P^+$ layer 107 as an anode, is formed between the $N^+$ layer 104 and the $P^+$ layer 107. The $P^+$ layer 107 is connected to the voltage source Vss (GND) on the low potential side commonly with the $N^+$ layer 105 being the source region.

Next, a discharge operation in the NMOS transistor 100 when an electrostatic surge is applied to the output terminal OUT will be described. For instance, if the electrostatic surge of a negative (−) polarity is applied to the output terminal OUT, the potential of the $N^+$ layer 104 connected to the output terminal OUT will become lower than the potential of the $P^+$ layer 107 connected to the voltage source Vss (GND) on the low potential side. In this case, the parasitic diode 109 performs a forward operation, and therefore, it becomes possible to easily let the electrostatic surge flow from the output terminal OUT through the voltage source Vss (GND). On the other hand, if electrostatic surge of a positive (+) polarity is applied to the output terminal OUT, the parasitic diode 109 performs a backward operation. However, even in this case, because the NMOS transistor 100 constitutes the output circuit together with the PMOS transistor 200, which will be mentioned below, the positive polarity electrostatic surge will flow toward the PMOS transistor 200 side and the NMOS transistor 100 should not be damaged.

Figure 1B:
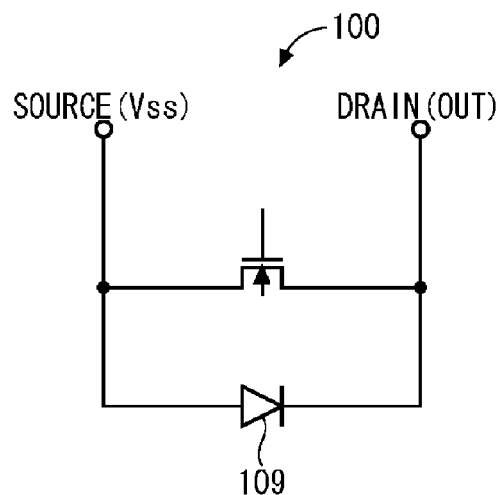
FIG. 1B is a diagram showing an equivalent circuit of the NMOS transistor according to one embodiment of the present invention.

FIG. 1B shows an equivalent circuit of the NMOS transistor 100. Referring to FIG. 1B, it can be seen that the parasitic diode 109 having a simplex polarity is disposed between the drain terminal and the source terminal and in parallel with the MOS transistor structure, by having the $P^+$ layer 107 formed adjacent to the $N^+$ layer 104 (i.e., FIG. 1A).

PMOS Transistor

Figure 2A:
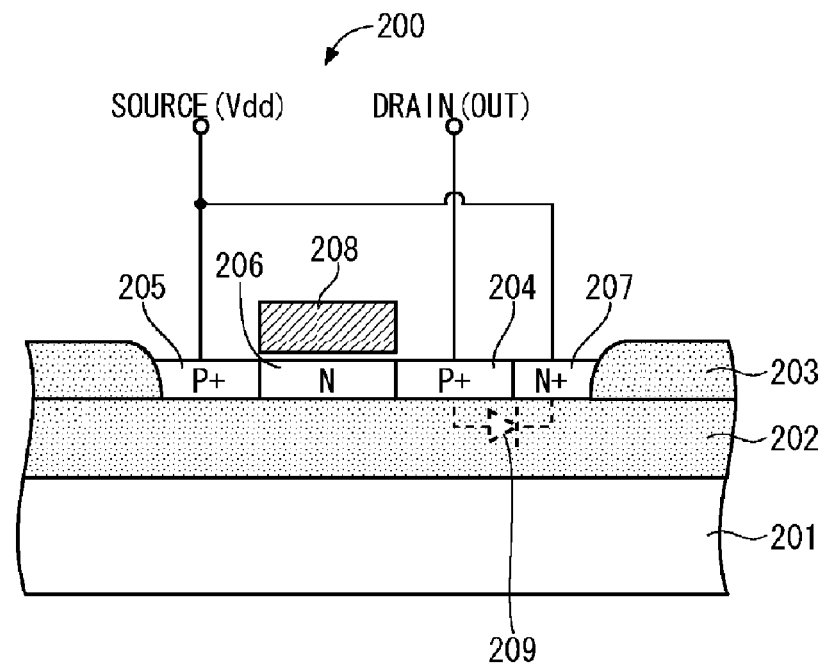
FIG. 2A is a schematic view showing a structure of a PMOS transistor according to one embodiment of the present invention.

FIG. 2A is a schematic view showing a structure of a PMOS transistor 200 which is a semiconductor device according to one embodiment of the present invention. In this embodiment, the PMOS transistor 200 is an FD type PMOS transistor which is formed on an SOI substrate, and for instance constitutes an output circuit of a semiconductor integrated circuit together with the above-described FD type NMOS transistor 100. In the structure of this embodiment, it is also possible to use a PD type PMOS transistor. Furthermore, instead of using an SOI substrate, it is possible to use an SOS (silicon on sapphire) substrate where a monocrystal silicon layer is formed on the surface of a sapphire, an SOS (silicon on spinel) substrate where a monocrystal silicon layer is formed on the surface of a spinel, or the like.

The PMOS transistor 200 has a support substrate 201, a buried insulation film 202, a field insulation film 203, a $P^+$ layer 204 (first diffusion layer) and a $P^+$ layer 205 (second diffusion layer), an N layer 206 (third diffusion layer), an $N^+$ layer 207 (fourth diffusion layer) and a gate 208. The support substrate 201 is, for instance, a silicon substrate. The buried insulation film 202 is, for instance, a silicon oxide film. The field insulation film 203 is, for instance, a silicon oxide film for element separation and is formed by a normal LOCOS (local oxidation of silicon) method etc. On a monocrystal silicon layer, i.e. the SOI substrate, over the buried insulation film 202, the P+ layers 204 and 205, the N layer 206 and the N+ layer 207 are disposed in the lateral direction. The P+ layer 204 corresponds to a drain region of the PMOS transistor 200 and is connected to an output terminal OUT of the semiconductor integrated circuit. The P+ layer 205 corresponds to a source region of the PMOS transistor 200 and is connected to a voltage source Vdd on the high potential side. The N layer 206 corresponds to a channel region of the PMOS transistor 200, on the surface of which a surface inversion layer, i.e. a channel, that connects the drain region and the source region is formed by applying negative voltage to the gate 208. When the PMOS transistor 200 is switched on as negative voltage is applied to the gate 208, a depletion layer expands over the entire N layer 206 by which the channel region becomes fully depleted. The N+ layer 207 is formed adjacent to the P+ layer 204 that is the drain region, and a parasitic diode 209 having a simplex polarity, which takes the P+ layer 204 as an anode and the N+ layer 207 as a cathode, is formed between the P+ layer 204 and the N+ layer 207. The N+ layer 207 is connected to the voltage source Vdd on the high potential side in common with the P+ layer 205 that is the source region.

Next, a discharge operation in the PMOS transistor 200 when electrostatic surge is applied to the output terminal OUT will be described. For instance, if electrostatic surge of a positive (+) polarity is applied to the output terminal OUT, the potential of the P+ layer 204 connected to the output terminal OUT will become higher than the potential of the N+ layer 207 connected to the voltage source Vdd on the high potential side. In this case, the parasitic diode 209 performs a forward operation, and therefore, it becomes possible to easily let the electrostatic surge flow from the output terminal OUT through the voltage source Vdd. On the other hand, if electrostatic surge of a negative (−) polarity is applied to the output terminal OUT, the parasitic diode 209 performs a backward operation. However, even in this case, because the PMOS transistor 200 constitutes the output circuit together with the above-described NMOS transistor 100, the negative polarity electrostatic surge will flow toward the NMOS transistor 100 side and the PMOS transistor 200 should not be damaged.

Figure 2B:
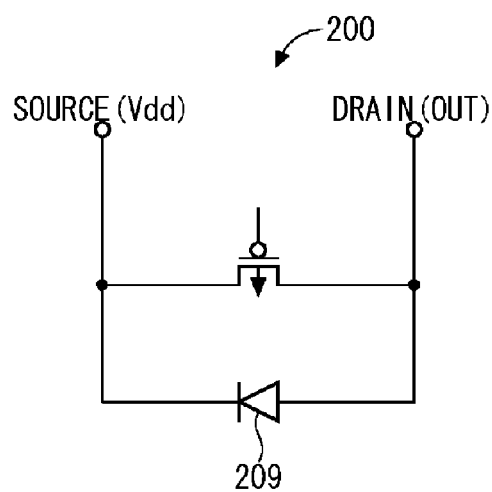
FIG. 2B is a diagram showing an equivalent circuit of the PMOS transistor according to one embodiment of the present invention.

FIG. 2B shows an equivalent circuit of the PMOS transistor 200. Referring to FIG. 2B, it can be seen that the parasitic diode 209 having a simplex polarity is disposed between the drain terminal and the source terminal and in parallel with the MOS transistor structure, by having the N+ layer 207 formed adjacent to the P+ layer 204 (q.v. FIG. 2A).

ESD Protection Circuit

Figure 3:
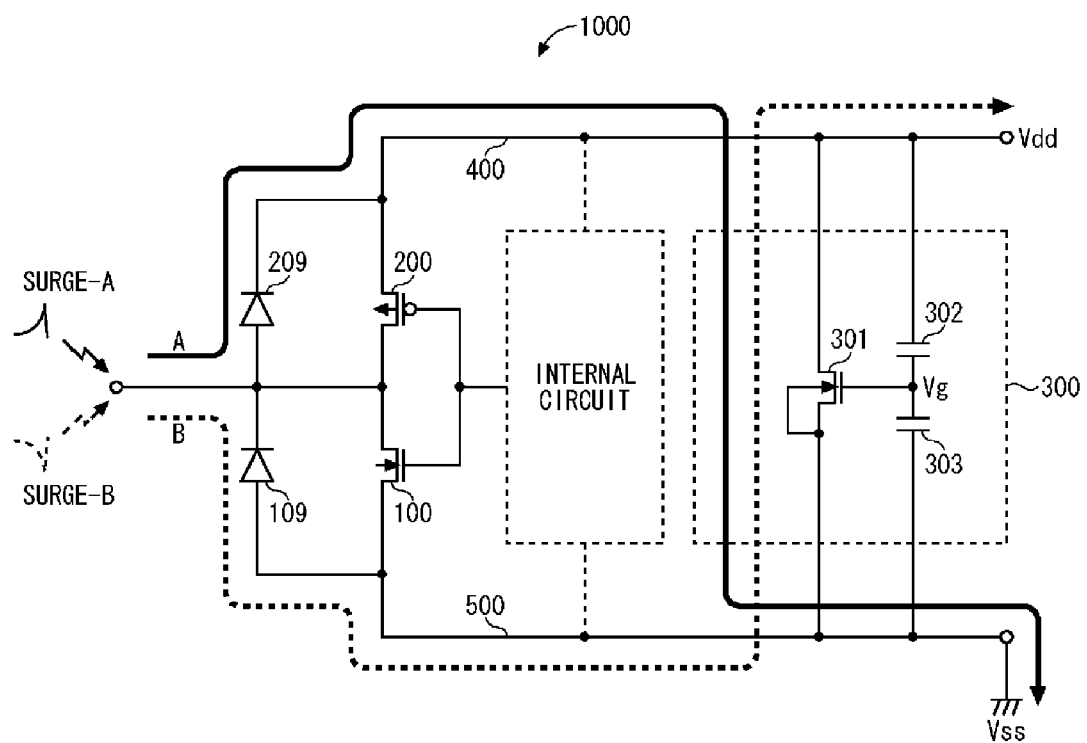
FIG. 3 is a diagram showing a structure of an electrostatic discharge damage protection circuit.

FIG. 3 is a schematic view showing a structure of an ESD protection circuit 1000 having an output circuit constituted of an NMOS transistor 100 and a PMOS transistor 200.

The ESD protection circuit 1000 includes the NMOS transistor 100, the PMOS transistor 200, an inter-power-supply protection circuit 300, a Vdd power line 400 and a Vss power line 500.

As shown in the equivalent circuit of FIG. 1B, the NMOS transistor 100 has a parasitic diode 109 which is disposed in parallel with the MOS transistor structure. As shown in the equivalent circuit of FIG. 2B, the PMOS transistor 200 has a parasitic diode 209 which is disposed in parallel with the MOS transistor structure. The NMOS transistor 100 and the PMOS transistor 200 has a common drain terminal (D) which is connected to an output terminal OUT of the semiconductor integrated circuit. The NMOS transistor 100 and the PMOS transistor 200 has a common gate terminal (G) which is connected to an inner circuit of the semiconductor integrated circuit. A source terminal (S1) of the NMOS transistor 100 is connected to a voltage source Vss (GND) on the low potential side via the Vss power line 500. A source terminal (S2) of the PMOS transistor 200 is connected to a voltage source Vdd on the high potential side via the Vdd power line 400.

The inter-power-supply protection circuit 300 has a protection transistor 301, and capacitors 302 and 303. The protection transistor 301 is connected between the Vdd power line 400 on the high potential side and the Vss power line 500 on the low potential side. A gate of the protection transistor 301 is connected to the Vdd power line 400 via the capacitor 302, and to the Vss power line 500 via the capacitor 303. In this case, given that the gate voltage of the protection transistor 301 is Vg, the capacity of the capacitor 302 is C1, and the capacity of the capacitor 303 is C2, the following formula can be obtained.

$$Vg = (Vdd - Vss) \times C1/(C1 + C2) \quad (1)$$

In a normal state, the protection transistor 301 has to be switched off, and therefore, the capacities C1 and C2 are set so that Vg becomes smaller than a threshold voltage Vth of the protection transistor 301. Although the protection transistor 301 in this embodiment is an NMOS transistor, it is also possible to use a PMOS transistor instead.

Next, a discharge operation in the ESD protection circuit 1000 when electrostatic surge is applied to the output terminal OUT will be described.

When an electrostatic surge SURGE-A of a positive (+) polarity is applied to the output terminal OUT, the parasitic diode 109 of the NMOS transistor 100 is biased in the backward direction and the parasitic diode 209 of the PMOS transistor 200 is biased in the forward direction. Therefore, the SURGE-A will flow toward the Vdd power line 400 via the parasitic diode 209 of the forward direction. At this time, the SURGE-A that has flowed into the Vdd power line 400 will momentarily bring up the potential of the Vdd power line 400. In this case, given that the potential of the SURGE-A is Vsa and that the gate voltage of the protection transistor 301 at the time when the SURGE-A is applied is Vg', the following formula can be obtained.

$$Vg' = (Vsa - Vss) \times C1/(C1 + C2) \quad (2)$$

Normally, since the potential of the SURGE-A is considered as several 100V (Vsa>>Vdd), it will become 'Vg'>>Vg in applying formula (1) and formula (2). Since this gate voltage Vg' is larger than the threshold voltage Vth of the protection transistor 301, the protection transistor 301 will be switched on due to the SURGE-A being applied. When the protection transistor is switched on, the Vdd power line 400 and the Vss power line 500 will be short-circuited, and the SURGE-A will flow into the voltage source Vss (GND) on the low potential side. In other words, when the SURGE-A of a positive polarity is applied, the SURGE-A will be discharged following a route indicated by arrow A shown in FIG. 3. That is, the SURGE-A will be discharged following a route of: parasitic diode 209→Vdd power line 400→inter-power-supply protection circuit 300→Vss (GND). In this way, because there is no parasitic diode of backward direction operation in the discharge route of the SURGE-A, the ability of the device to resist against electrostatic discharge damage can be improved.

On the other hand, when the electrostatic surge SURGE-B of a negative (−) polarity is applied to the output terminal OUT, the parasitic diode 109 of the NMOS transistor 100 is biased in the forward direction and the parasitic diode 209 of the PMOS transistor 200 is biased in the backward direction. Therefore, the SURGE-B will flow toward the Vss power line 500 via the parasitic diode 109 of the forward direction. At this time, the SURGE-B that has flowed into the Vss power line 500 will momentarily bring down the potential of the Vss power line 500. In this case, given that the potential of the SURGE-B is Vsb and that the gate voltage of the protection transistor 301 at the time when the SURGE-B is applied is Vg", the following formula can be obtained.

$$Vg''=(Vdd-(-Vsb))-C1/(C1+C2) \quad (3)$$

Normally, since the potential of the SURGE-B is considered as several −100V, it will become 'Vg">>Vg in applying formula (1) and formula (3). Since this gate voltage Vg" is larger than the threshold voltage Vth of the protection transistor 301, the protection transistor 301 will be switched on due to the SURGE-B being applied. When the protection transistor is switched on, the Vdd power line 400 and the Vss power line 500 will be short-circuited, and the SURGE-B will flow into the voltage source Vdd on the high potential side. In other words, when the SURGE-B of a negative polarity is applied, the SURGE-B will be discharged following a route indicated by arrow B shown in FIG. 3. That is, the SURGE-B will be discharged following a route of: parasitic diode 109→Vss power line 500→inter-power-supply protection circuit 300→Vdd. In this way, because there is no parasitic diode of backward direction operation in the discharge route of the SURGE-B, the ability of the device to resist against electrostatic discharge damage can be improved.

As described above, according to the semiconductor device of the embodiment of the present invention, in the NMOS transistor 100 formed on the SOI substrate, an impurity region (P⁺ layer 107) having a different polarity from the drain region (N⁺ layer 104) and the source region (N⁺ layer 105) is formed adjacent to the drain region, and the parasitic diode 109 having a simplex polarity is formed between the impurity region and the drain region. By this arrangements, for instance, electrostatic surge of a negative (−) polarity being applied to the drain terminal connected to the output terminal OUT can be easily discharged to the voltage source Vss (GND). Furthermore, in the PMOS transistor 200 formed on the SOI substrate, an impurity region (N⁺ layer 207) having a different polarity from the drain region (P⁺ layer 204) and the source region (P⁺ layer 205) is formed adjacent to the drain region, and the parasitic diode 209 having a simplex polarity is formed between this impurity region and the drain region. By such arrangements, for instance, electrostatic surge of a positive (+) polarity being applied to the drain terminal connected to the output terminal OUT can be easily discharged to the voltage source Vdd. Moreover, by constituting the ESD protection circuit 1000 with the output circuit being made up of the NMOS transistor 100 and the PMOS transistor 200, a discharge route of the electrostatic surge should not include any parasitic diode of backward direction operation whether the applied electrostatic surge is of a positive polarity or a negative polarity. This makes it possible to improve the resistance ability of the device against electrostatic discharge damage.

While the preferred embodiment of the invention has been described using specific terms, such description is for illustrative purposes only, and it is to be understood that changes and variations may be made without departing from the spirit or the scope of the following claims.

This application claims priority to Japanese Patent Application No. 2004-330159. The entire disclosures of Japanese Patent Application No. 2004-330159 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

What is claimed is:

1. A semiconductor device having an ESD protection function, comprising:
   an SOI substrate having a semiconductor layer on an insulation layer;
   a first diffusion layer of a first conductivity type on the semiconductor layer, the first diffusion layer is a drain region coupled to an external terminal;
   a second diffusion layer of the first conductivity type on the semiconductor layer, the second diffusion layer is a source region;
   a third diffusion layer of a second conductivity type on the semiconductor layer adjacent to the first and second diffusion layers,
   a fourth diffusion layer of the second conductivity type on the semiconductor layer directly adjoining with the first diffusion layer, the fourth diffusion layer and the second diffusion layer are electrically coupled together to a power supply terminal; and
   a gate over the third diffusion layer.

2. The semiconductor device according to claim 1, wherein the first to third diffusion layers and the gate are a field effect transistor which operates in a state in which the third diffusion layer is completely depleted.

3. The semiconductor device according to claim 2, wherein the first and fourth diffusion layers are a parasitic diode having a simplex polarity.

4. The semiconductor device according to claim 1, wherein the first and second conductivity types are respectively n-type and p-type conductivities, and the second and fourth diffusion layers are connected together to a ground potential source.

5. The semiconductor device according to claim 1, wherein the first and second conductivity types are respectively p-type and n-type conductivities, and the second and fourth diffusion layers are connected together to a high potential source.

* * * * *